United States Patent
Uemura et al.

(10) Patent No.: US 6,809,634 B2
(45) Date of Patent: Oct. 26, 2004

(54) BUZZER-DRIVING APPARATUS

(75) Inventors: Hideaki Uemura, Mie (JP); Kenji Wakana, Mie (JP)

(73) Assignee: Sumitomo Wiring Systems, Ltd (JP)

( * ) Notice: Subject to any disclaimer, the term of this patent is extended or adjusted under 35 U.S.C. 154(b) by 359 days.

(21) Appl. No.: 10/128,964

(22) Filed: Apr. 24, 2002

(65) Prior Publication Data

US 2002/0180593 A1 Dec. 5, 2002

(30) Foreign Application Priority Data

Apr. 25, 2001 (JP) .................................. 2001-127194

(51) Int. Cl.[7] .............................................. G08B 3/10
(52) U.S. Cl. ............................ 340/384.73; 340/384.71; 340/388.1
(58) Field of Search ..................... 340/384.1, 384.71, 340/384.73, 384.7, 384.5, 388.1; 116/142 R; 381/190, 191

(56) References Cited

U.S. PATENT DOCUMENTS

| | | | |
|---|---|---|---|
| 4,149,153 A | * | 4/1979 | Shigemori et al. ..... 340/384.73 |
| 4,297,682 A | * | 10/1981 | Spletzer ................. 340/384.73 |
| 4,396,904 A | * | 8/1983 | Hanaoka ................ 340/309.16 |
| 4,724,424 A | * | 2/1988 | Nakashima et al. ..... 340/384.5 |
| 5,414,406 A | * | 5/1995 | Baxter ..................... 340/388.1 |
| 6,198,405 B1 | * | 3/2001 | Andersson et al. .... 340/815.45 |

FOREIGN PATENT DOCUMENTS

| | | |
|---|---|---|
| JP | 9-319375 | 5/1996 |
| JP | 8-202372 | 8/1996 |

\* cited by examiner

Primary Examiner—Brent A. Swarthout
(74) Attorney, Agent, or Firm—Harness, Dickey & Pierce, P.L.C.

(57) ABSTRACT

A pulse signal, having a buzzer-driving frequency, for driving a buzzer (3) is generated by a free running timer of a timer management section of a microcomputer (1). The timer management section operates independently of software processing of the microcomputer (1). A transistor (2) is turned on and off by the pulse signal having the buzzer-driving frequency. Accordingly, electricity flows through the buzzer (3). The buzzer (3) in turn, generates a sound.

18 Claims, 6 Drawing Sheets

BUZZER-DRIVING APPARATUS

CROSS-REFERENCE TO RELATED APPLICATIONS

This application claims priority to Japanese Patent Application No. 2001-127194 filed Apr. 25, 2001, which application is herein expressly incorporated by reference.

FIELD OF THE INVENTION

The present invention relates to a buzzer-driving apparatus. More particularly, the present invention provides an alarm when the driver has forgotten to remove a key from a vehicle keyhole or turn out a light. An alarm sounds if the key is left, or the light is on.

BACKGROUND OF THE INVENTION

Some vehicles sound an alarm to inform the driver that the driver has forgotten to remove the key from the keyhole or turn out a light. The alarm is in the buzzer-driving apparatus.

A prior art buzzer-driving apparatus is shown in FIG. 7. In FIG. 7, reference numeral 51 denotes a microcomputer. Reference symbol P denotes a general-purpose output port of the microcomputer 51. Reference numeral 52 denotes a transistor; 53 a buzzer; 54 a sound pressure adjustment resistance; 55 a base protection resistance of the transistor 52; and 56 a level-fixing resistance of the transistor 52. A battery is connected to a terminal of the sound pressure adjustment resistance 54. The battery is disposed at the side opposite to the side at which the buzzer 53 is connected to the sound pressure adjustment resistance 54.

The buzzer 53 contains a coil. The microcomputer 51 outputs a signal to turn the transistor 52 on and off at constant periods of $f_0$ from the general-purpose output port P. The transistor 52 is turned on and electric current flows through the coil. An iron core, disposed at the center of the coil, is magnetized and attracts a diaphragm disposed above the iron core when the transistor 52 is on. When the transistor 52 is turned off, electric current does not flow through the coil. As this occurs, the diaphragm is repelled from the core. As this operation is repeated, the diaphragm vibrates at a constant frequency. A buzzer gives a big sound due to the resonant effect of the buzzer case.

In the above-described conventional buzzer-driving apparatus, during a timer interruption, pulse signals are generated by software flowchart shown in FIG. 8. The software starts every periodical timer interruption. Initially, it is determined whether communication processing of wait is executed (step S11). If yes, processing corresponding to the communication processing of wait is executed (step S12).

Next, it is determined whether switch input of wait has been executed (step S13). If yes, processing corresponding to the switch input is executed (step S14). When all the processing of wait has finished, the level of an output of the general-purpose output port P is determined (step S15). That is, if the level of the output of the general-purpose output port P is High (high-level potential), its output is set to Low (low-level potential) (step S16). If the level of the output of the general-purpose output port P is Low (low-level potential), its output is set to High (high-level potential) (step S17).

As described above, the communication processing of wait and the processing based on the input of wait are executed before cutting the switching of the output of the general-purpose output port P. Thus, when the processing for the interruption takes a long time, the processing time of the software is delayed. As a result, a buzzer-driving frequency deviates slightly.

For example, as shown in FIG. 9, at ②, no delay occurs because the communication processing of wait and the processing based on the input of wait are not executed. But in ①, delay occurs because of the communication processing of wait and the processing based on the input of wait. In ③, delay occurs because of the communication processing of wait.

The deviation of the oscillation frequency poses a problem. A slight change in the frequency (buzzer-driving frequency) causes a resonant disk of the buzzer to be attracted and repelled out of sync. Therefore, the tone quality and musical interval of the buzzer are unstable. This generates a distorted buzzer sound.

SUMMARY OF THE INVENTION

The present invention overcomes the above-described problem. Accordingly, it is an object of the present invention to provide a high-quality buzzer-driving apparatus. The apparatus enables the tone quality and musical interval of a buzzer to be stable because of a stable supply of a pulse signal having a buzzer-driving frequency.

To achieve the object, in a first embodiment of the invention, a buzzer-driving apparatus is provided to drive a buzzer by using a signal generated by a microcomputer. The microcomputer includes a free running timer counting a clock of the microcomputer, a register storing a value set thereto; and an output port to output a signal generated based on the value.

When the value is set in the register, an output is set to a low-level potential at the output port and a value counted by the free running timer is reset. When the value counted by the free running timer is equal to the value, the output of the output port is inverted and the value counted by the free running timer is reset. Thus, comparing the value counted by the free running timer with the value is repeated. A signal is outputted to the output port to drive the buzzer.

In the first embodiment, the signal driving the buzzer is generated by using the free running timer of the microcomputer. Accordingly, the signal is generated without being affected by software processing of the microcomputer.

In a second embodiment, a buzzer-driving apparatus is provided to drive a buzzer by using a signal generated by a microcomputer. The microcomputer includes a free running timer counting a clock of the microcomputer; a register storing first and second values set thereto; and an output port to output a generated signal generated based on the first and second values.

When the values are set in the register, an output is set to a high-level potential of the output port and a value counted by the free running timer is reset. When the value counted by the free running timer is equal to the first value, the output of the output port is set to a low-level potential. When the value counted by the free running timer is equal to the second value, the output of the output port is set to a high-level potential and the value counted by the free running timer is reset. Thus, comparing the value counted by the free running timer with the first and second values is repeated, and a signal is outputted to the output port to drive the buzzer.

In the second embodiment, the signal driving the buzzer is generated by using the free running timer of the microcomputer. Accordingly, the signal is generated without being influenced by the software processing of the microcomputer.

According to a third embodiment, in addition to the construction of the first or second embodiments, a separate excitation type buzzer is driven.

In the third embodiment, the separate excitation type buzzer is driven by the signal having a frequency generated by the free running timer of the microcomputer.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiment(s) is merely exemplary in nature and is in no way intended to limit the invention, its application, or uses.

Figure 1:
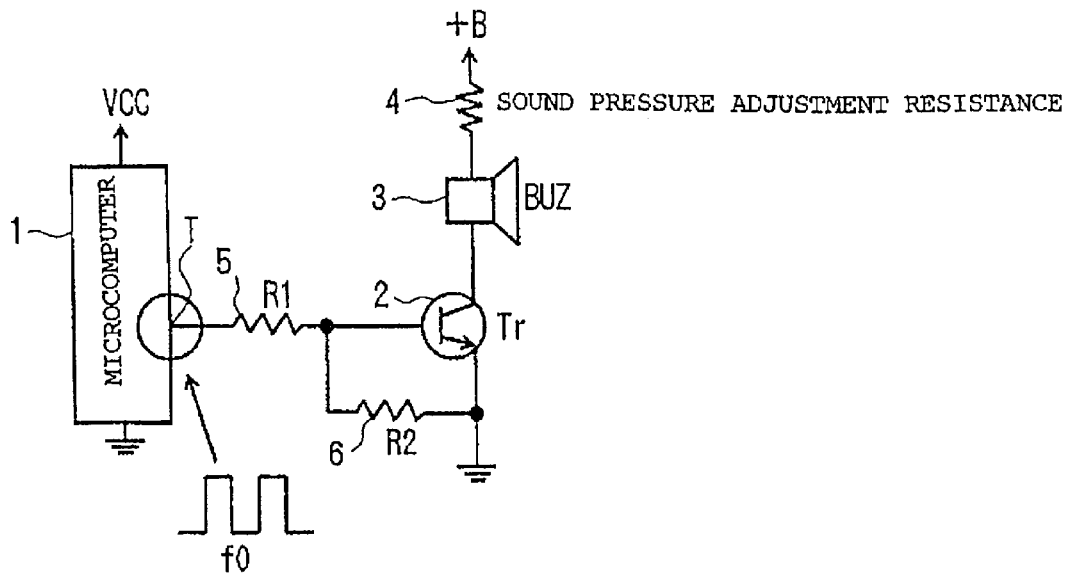
FIG. 1 is a schematic block diagram view of a first embodiment of the buzzer-driving apparatus of the present invention.
Figure 3:
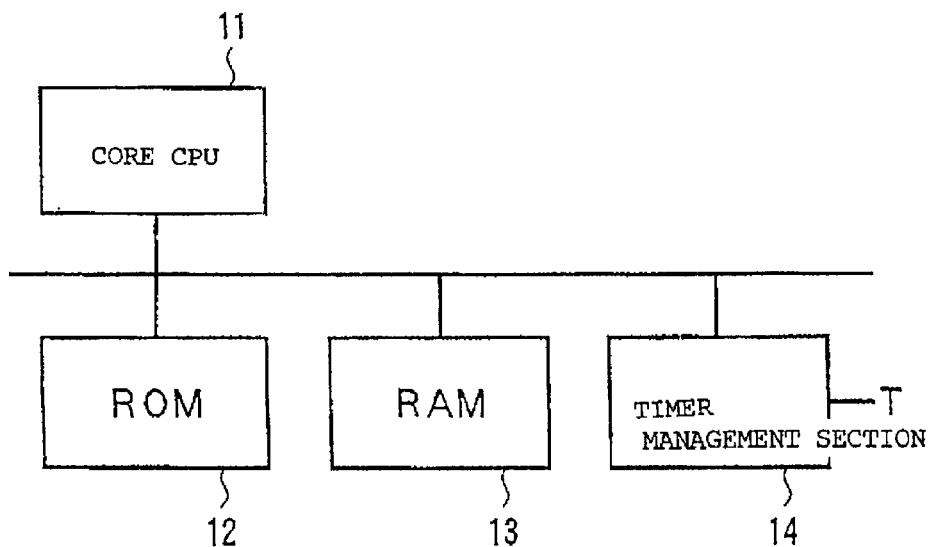
FIG. 3 is a schematic block diagram view of the construction of a microcomputer of the first embodiment.

FIGS. 1 and 3 illustrate a first embodiment of the buzzer-driving apparatus according to the present invention.

In FIG. 1, the buzzer-driving apparatus includes a microcomputer 1; a transistor 2; a buzzer 3; a sound pressure adjustment resistance 4; a base protection resistance 5 of the transistor 2; and a level-fixing resistance 6 of the transistor 2 when the microcomputer 1 is off. A battery is connected to a terminal of the sound pressure adjustment resistance 4. The battery is disposed at the side opposite to the side at which the buzzer 3 is connected to the sound pressure adjustment resistance 4.

Figure 2:
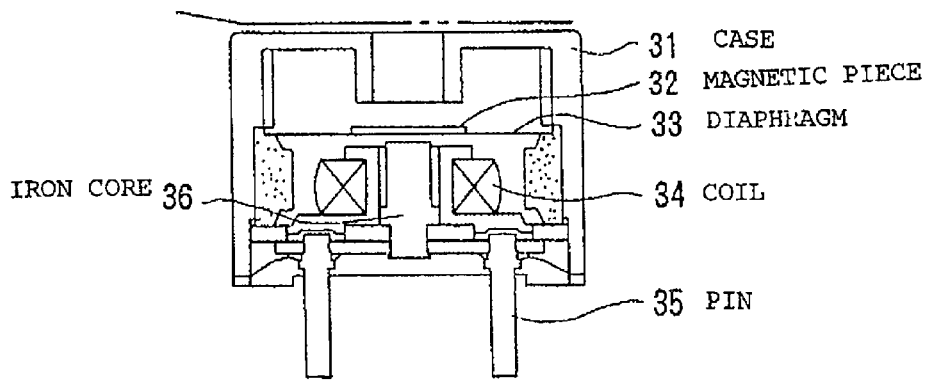
FIG. 2 is a sectional view of the construction of a buzzer of the first embodiment.

FIG. 2 is a sectional view of the buzzer 3. The buzzer 3 includes a case 31, a magnetic piece 32, a diaphragm 33, a coil 34, a pin 35, and an iron core 36.

FIG. 3 is a schematic block diagram of the microprocessor 1. The microprocessor includes a core CPU 11 (Central Processing Unit), a ROM 12 (Read-Only Memory), a RAM 13 (Random Access Memory); and a timer management section 14. The timer management section 14 has a free running timer output terminal T.

The timer management section 14 operates in free run (free running timer) independently of software processing of the core CPU 11. The timer management section 14 has a register in which a parameter for determining a signal to be outputted to the free running timer output terminal T is set. The core CPU 11 sets a value in the register to control the signal to be outputted to the free running timer output terminal T.

Figure 4:
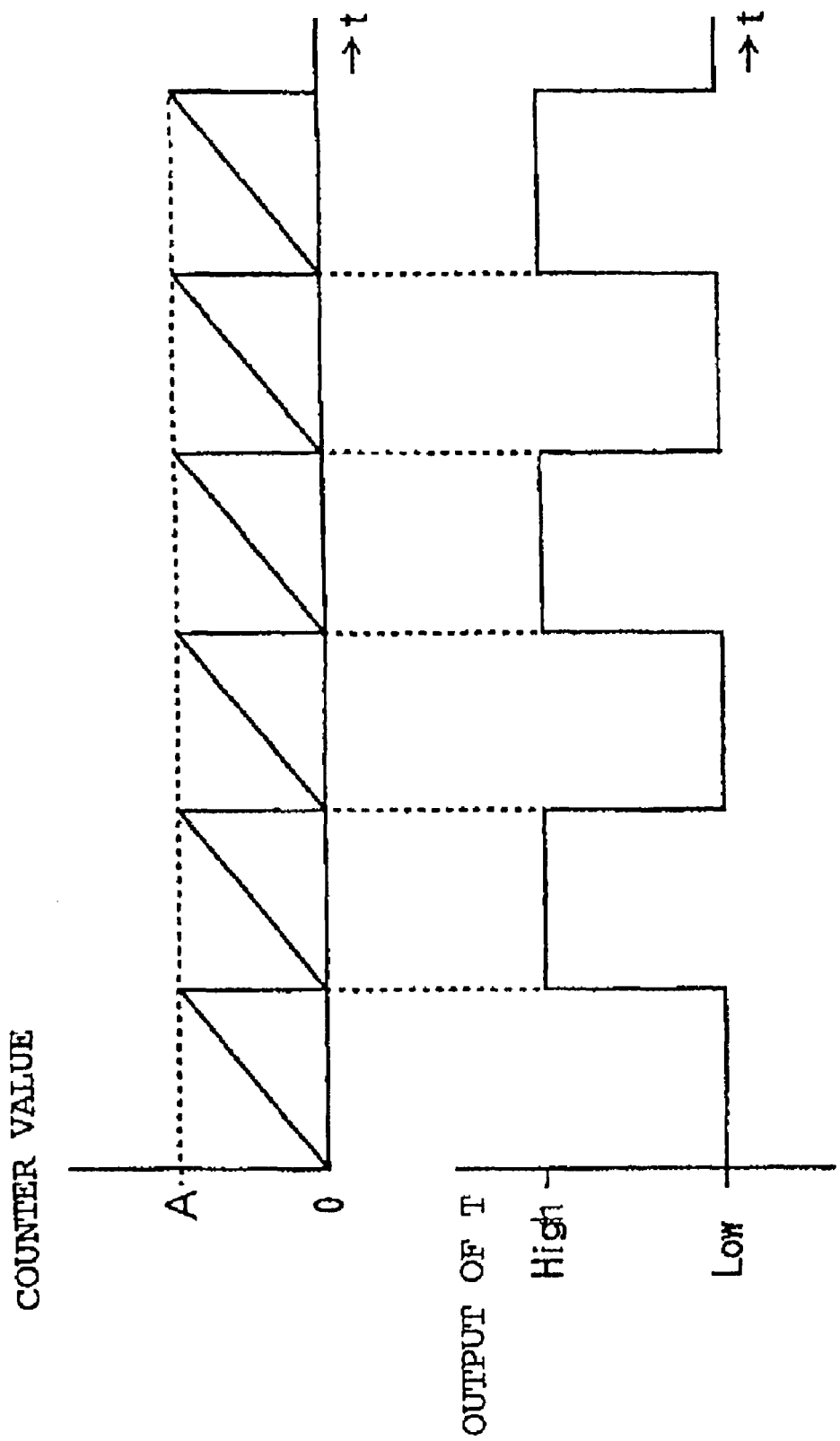
FIG. 4 is a schematic view of a timing chart showing a method of generating a buzzer-driving frequency of the first embodiment.

For example, as shown in FIG. 4, initially the core CPU 11 sets a counter value A in the register as the parameter. A clock signal is counted, with the output of the free running timer output terminal T set to Low (low-level potential). When the counter value becomes equal to the value A, the counter is cleared and the output of the free running timer output terminal T is inverted from Low to High (high-level potential).

When a value counted by the counter becomes equal to the value A again, the counter is cleared, and the output of the free running timer output terminal T is inverted from High to Low.

The core CPU 11 generates a pulse signal having a frequency set by using the parameter and outputs the pulse signal to the free running timer output terminal T.

In the buzzer-driving apparatus, the microcomputer 1 generates the pulse signal having a buzzer-driving frequency. The pulse signal is outputted from the free running timer output terminal T to turn the transistor 2 on and off at the buzzer-driving frequency. Thus, the buzzer 3 generates a sound.

Figure 5:
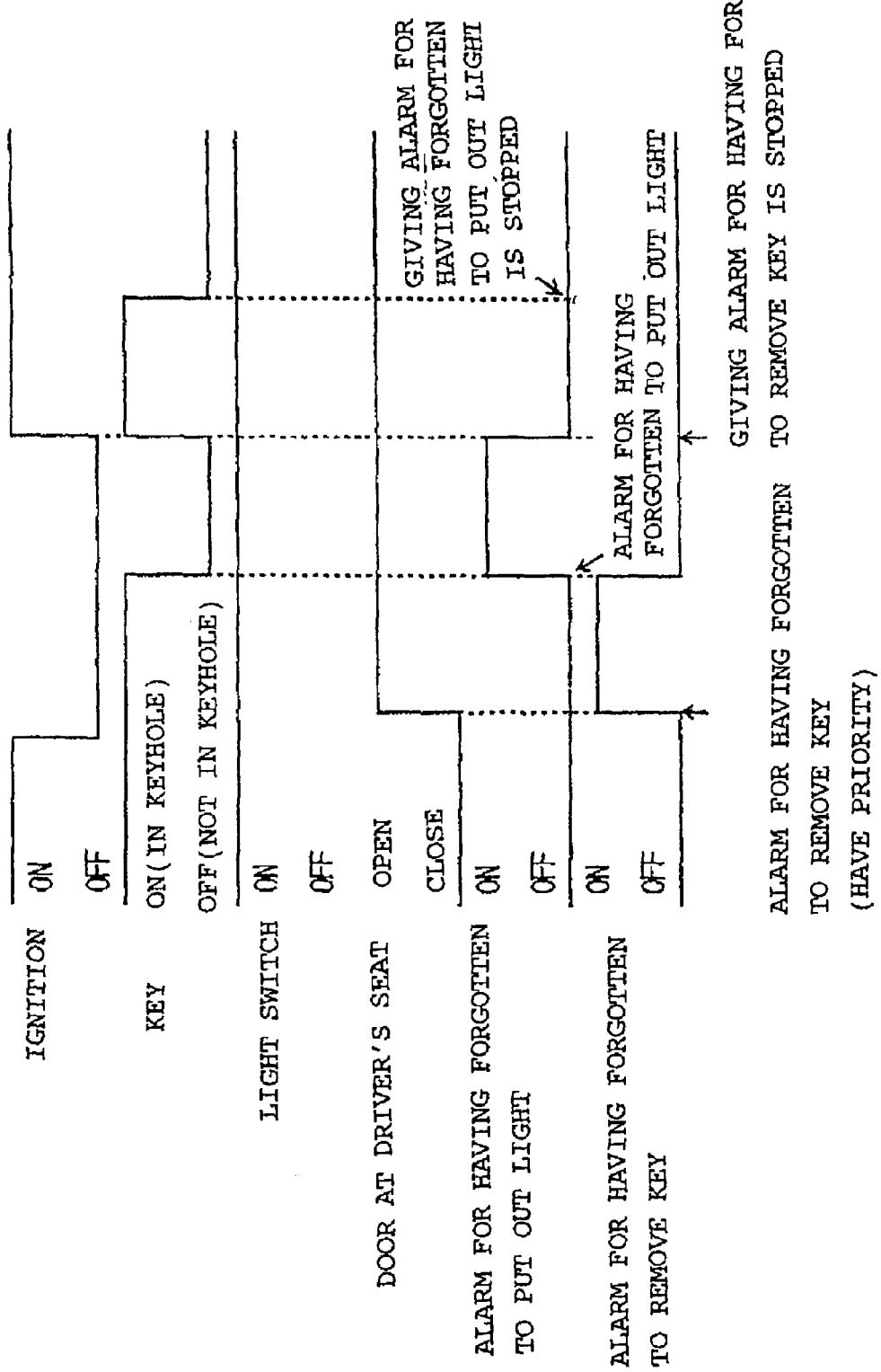
FIG. 5 is a schematic view of a timing chart showing a buzzer-driving condition of the buzzer-driving apparatus of the first embodiment.

More specifically, as seen in FIG. 5, when an operation condition exist, such as the key is ON (key is in keyhole and door alongside driver's seat is open) and an alarm for not removing the key from the keyhole is to be generated or an operation condition exist, such as the light is ON and the door alongside driver's seat is open and an alarm for not having put out the light is to be generated, the core CPU 11 of the microcomputer 1 sends a signal to the register indicating that the pulse signal, with the buzzer-driving frequency set in the timer management section 14, is outputted to the free running timer output terminal T.

Based on the parameter set in the register by the core CPU 11, the timer management section 14 outputs the pulse signal, which has a frequency set by counting the clock signal, to the free running output terminal T.

The transistor 2 is turned on and off by the signal outputted to the free running output terminal T of the microcomputer 1. When the transistor 2 is turned on, electric current flows through the coil 34 of the buzzer 3. Consequently, the iron core 36 disposed at the center of the coil 34 is magnetized and attracts the diaphragm 33. When electric current does not flow through the coil 34, the diaphragm 33 returns to its original state. While this operation is being repeated, the diaphragm 33 vibrates at a constant frequency. Consequently, the buzzer 3 generates a sound due to the resonant effect of the case 31.

As seen in FIG. 5, a stop condition for not having removed the key from the keyhole is established when the key is not in the keyhole, door alongside driver's seat is closed or ignition is ON. Also, a stop condition for not having put out the light is established when the light is OFF, door at driver's seat is closed or ignition is ON. When either one of the stop conditions is established, a stop alarm signal is generated, and the core CPU 11 sets a parameter to stop the output of the signal of the free running output terminal T in the register and stops the output of the signal of the free running terminal T to prevent the buzzer 3 from generating a sound.

As described above, in the first embodiment, the transistor 2 is turned on and off by the pulse signal generated by the free running timer of the timer management section 14. The timer management section 14 operates independently of the software processing of the core CPU 11. Thus, even though an interruption occurs, the buzzer 3 is capable of providing a sound with a stable tone quality and interval without being affected by delay in other processing of the software.

In the first embodiment, when a value counted by the free running timer becomes equal to the value set in the register, the output of the free running timer output terminal T is inverted and the value counted by the free running timer is cleared. This operation is repeated. Thus the pulse signal can be stably generated at a duty ratio of 50%.

The buzzer 3 is of a separate excitation type to provide a sound by vibrating the diaphragm 33 at a predetermined frequency. Further, by setting the parameter in the timer management section 14, it is possible to change the frequency of the signal that turns the transistor 2 on and off, with the duty ratio being kept at 50%. Thus, it is possible to change the interval of the buzzer 3 by changing the frequency at which the diaphragm 33 is vibrated, depending on the kind of alarm.

Figure 6:
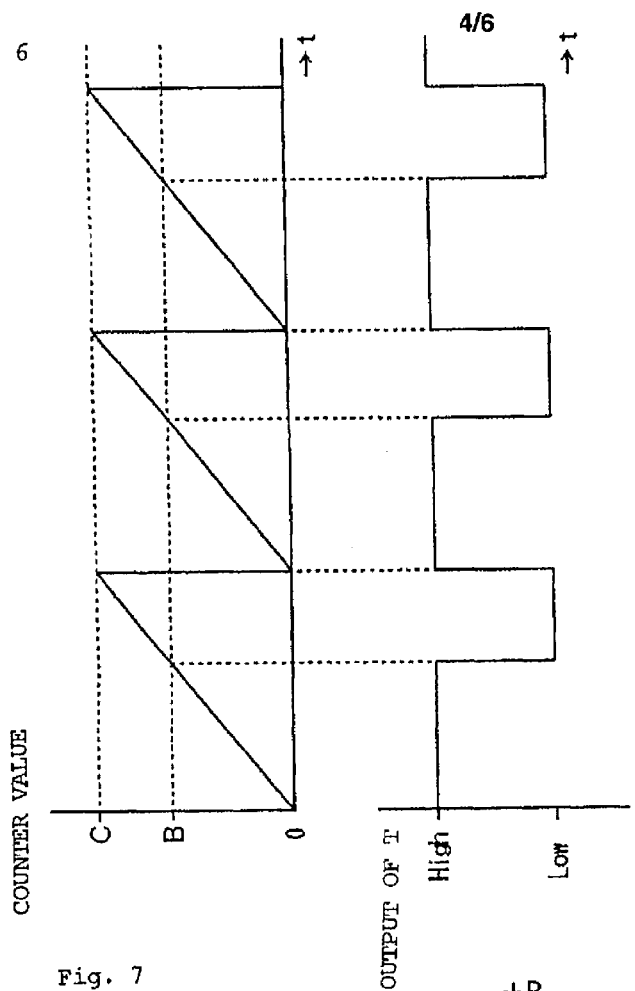
FIG. 6 is a schematic view of a timing chart showing a method of generating a buzzer-driving frequency of a second embodiment of the buzzer-driving apparatus of the present invention.
Figure 7:
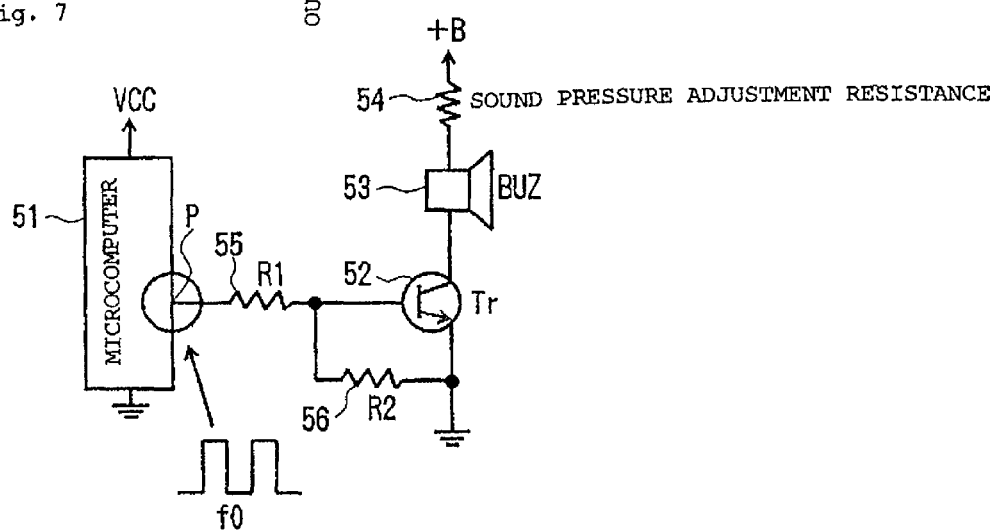
FIG. 7 is a schematic view of a block diagram showing a conventional buzzer-driving apparatus.
Figure 8:
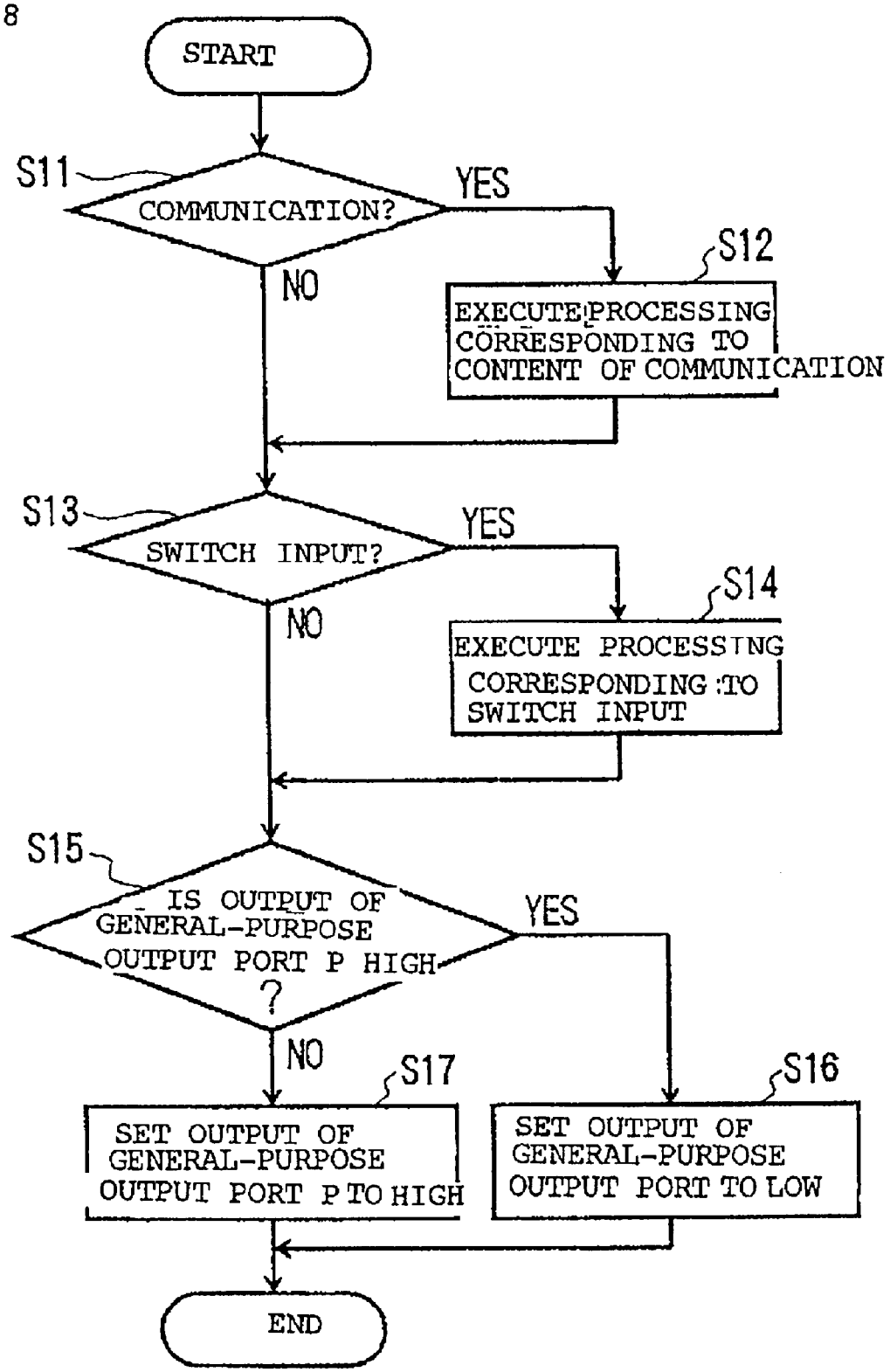
FIG. 8 is a schematic view of a flowchart showing conventional processing of generating a buzzer-driving frequency.
Figure 9:
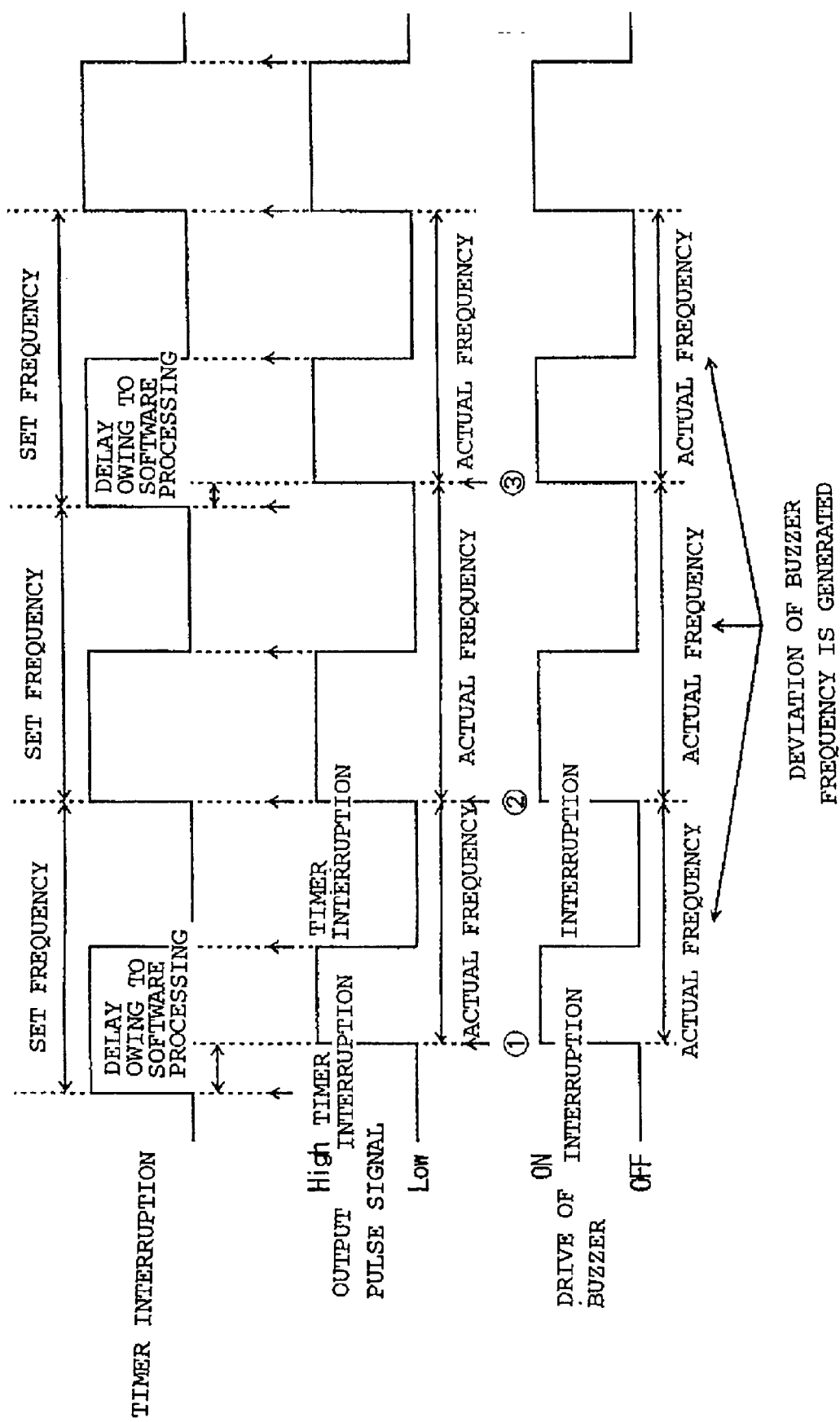
FIG. 9 is a schematic view of a buzzer-driving frequency of a conventional buzzer-driving apparatus.

FIG. 6 shows a second embodiment of the buzzer-driving apparatus of the present invention. The buzzer-driving apparatus of the second embodiment has a construction similar to that of the buzzer-driving apparatus of the first embodiment. Thus the parts of the buzzer-driving apparatus of the second embodiment that are the same as those of the buzzer-driving apparatus of the first embodiment are denoted by the reference numerals of the parts of the buzzer-driving apparatus of the first embodiment, and only the characteristic parts of the second embodiment are described below.

As shown in FIG. 6, initially a counter value B (first set value) and a counter value C (second set value) are set by the core CPU 11 in the register as the parameter. A clock signal is counted with an output of the free running timer output terminal T set to High (high-level potential). When the counter value becomes equal to the counter value B, the output of the free running timer output terminal T is set to Low (low-level potential).

The clock signal is again counted. When the counter value becomes equal to the counter value C, the counter counting the clock signal is cleared. The output of the free running timer output terminal T is set to High.

The core CPU 11 generates a pulse signal, which has a frequency set by using the parameter, and outputs the pulse signal to the free running timer output terminal T.

The transistor 2 is turned on and off by the signal outputted to the free running timer output terminal T. When the transistor 2 is turned on, electric current flows through the coil 34 of the buzzer 3. Consequently, the iron core 36, disposed at the center of the coil 34, is magnetized and attracts the diaphragm 33. When electric current is halted, the diaphragm 33 returns to its original position. While this operation is being repeated, the diaphragm 33 vibrates at a constant frequency. Consequently, the buzzer 3 provides a sound due to the resonant effect of the case 31.

As described above, in the second embodiment, the transistor 2 is turned on and off by the pulse signal generated by the free running timer of the timer management section 14. The timer management section 14 operates independently of the software processing of the core CPU 11. Thus, even though an interruption occurs, the buzzer 3 provides sound in a stable tone quality and interval without being affected by delay in other processing of the software.

In the second embodiment, when a value counted by the free running timer becomes equal to the value B set in the register, the output of the free running timer output terminal T is inverted. When a value counted by the free running timer becomes equal to the value C set in the register, the output of the free running timer output terminal T is inverted and the value counted by the free running timer is cleared. This operation is repeated. Thus the pulse signal can be generated stably at a desired duty ratio.

The buzzer 3 is a separate excitation type buzzer which generates sound by vibrating the diaphragm 33 at a predetermined frequency. Further by setting desired parameters in the timer management section 14, it is possible to change the frequency and duty ratio of the signal which turns the transistor 2 on and off. Thus, it is possible to change the interval of the buzzer 3, depending on the kind of alarm, by changing the duty ratio and frequency of the signal at which the diaphragm 33 is vibrated.

In the present invention, the buzzer is driven by the signal generated by the free running timer. The free running timer operates independently of software processing of the core CPU of the microcomputer. Accordingly, the buzzer is capable of providing sound with a stable tone quality and interval without being affected by delays in processing of the software.

Since the buzzer is of the separate excitation type, the tone quality and musical interval of the buzzer can be changed. This occurs by changing the frequency of the signal generated by the free running timer and it depends on the kind of alarm.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A buzzer-driving apparatus for driving a buzzer by using a signal generated by a microprocessor comprising:
   a free running timer counting a clock of said microprocessor;
   a register storing a set value thereto;
   an output port for outputting a signal generated based on the value;
   when said value is set in said register, an output of said output port is set to a low-level potential and a value counted by said free running timer is reset;
   when said value counted by said free running timer is equal to said set value, said output of said output port is inverted and said value counted by said free running timer is reset; and
   comparing said value counted by said free running timer with said value, repeating said comparing step and outputting a signal to said output port to drive said buzzer by using said signal.

2. A buzzer-driving apparatus for driving a buzzer by using a signal generated by a microprocessor comprising:
   a free running timer counting a clock of the microprocessor;
   a register storing first and second set values;

an output port for outputting a signal generated based on said first and second values;

when said values are set in said register, an output of said output port is set to a high-level potential and a value counted by said free running timer is reset;

when said value counted by said free running timer is equal to said first value, said output of said output port is set to a low-level potential;

when said value counted by said free running timer is equal to said second value, said output of said output port is set to a high-level potential and said value counted by said free running timer is reset, and comparing said value counted by said free running timer with said first and second values, repeating the comparing step, and outputting a signal to said output port to drive said buzzer by using said signal.

3. A buzzer-driving apparatus according to claim 1, wherein a buzzer of separate excitation type is driven.

4. A buzzer-driving apparatus according to claim 2, wherein a buzzer of separate excitation type is driven.

5. The buzzer driving apparatus according to claim 1, wherein said buzzer driving apparatus being in a vehicle.

6. The buzzer driving apparatus according to claim 5, wherein said buzzer being activated when an ignition key is ON and a door along a driver's seat is open.

7. The buzzer driving apparatus according to claim 5, wherein said buzzer being activated when a door along a driver's seat is open and a key is in an ignition and the key is in an OFF position.

8. The buzzer driving apparatus according to claim 5, wherein said buzzer being deactivated when the key is not in an ignition and a door along a driver's seat is closed.

9. The buzzer driving apparatus according to claim 5, wherein said buzzer being deactivated when a key is in an ignition and the key is in an ON position and a door alongside a driver's seat is open.

10. The buzzer driving apparatus according to claim 1, wherein said signal being generated at duty ratio of 50%.

11. The buzzer driving apparatus according to claim 1, wherein said buzzer generating different tones, frequency or sounds for different events which activate said buzzer.

12. The buzzer driving apparatus according to claim 2, wherein said buzzer driving apparatus being in a vehicle.

13. The buzzer driving apparatus according to claim 12, wherein said buzzer being activated when an ignition key is ON and a door along a driver's seat is open.

14. The buzzer driving apparatus according to claim 12, wherein said buzzer being activated when a door along a driver's seat is open and a key is in an ignition and the key is in an OFF position.

15. The buzzer driving apparatus according to claim 12, wherein said buzzer being deactivated when the key is not in an ignition and a door along a driver's seat is closed.

16. The buzzer driving apparatus according to claim 12, wherein said buzzer being deactivated when a key is in an ignition and the key is in an ON position and a door alongside a driver's seat is open.

17. The buzzer driving apparatus according to claim 2, wherein said signal being generated at duty ratio of 50%.

18. The buzzer driving apparatus according to claim 2, wherein said buzzer generating different tones, frequency or sounds for different events which activate said buzzer.

* * * * *